(12) United States Patent
Liu et al.

(10) Patent No.: US 11,380,223 B2
(45) Date of Patent: Jul. 5, 2022

(54) SCROLL AND ROLLABLE DISPLAY PANEL

(71) Applicant: BOE TECHNOLOGY GROUP CO., LTD., Beijing (CN)

(72) Inventors: Junhuan Liu, Beijing (CN); Shangchieh Chu, Beijing (CN); Hong Zhu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/203,237

(22) Filed: Mar. 16, 2021

(65) Prior Publication Data

US 2021/0390886 A1 Dec. 16, 2021

(30) Foreign Application Priority Data

Jun. 15, 2020 (CN) .......................... 202010543484.X

(51) Int. Cl.
*G09F 9/30* (2006.01)
*H05K 1/18* (2006.01)

(52) U.S. Cl.
CPC ............. *G09F 9/301* (2013.01); *H05K 1/189* (2013.01); *H05K 2201/10128* (2013.01)

(58) Field of Classification Search
CPC ..................... G09F 9/301; H05K 1/189; H05K 2201/10128
See application file for complete search history.

(56) References Cited

U.S. PATENT DOCUMENTS

| 2020/0170114 | A1* | 5/2020 | Choi | ..................... H05K 5/0217 |
| 2021/0083024 | A1* | 3/2021 | Song | ....................... G09F 9/301 |

FOREIGN PATENT DOCUMENTS

| CN | 105741683 | A | 7/2016 |
| CN | 105869522 | A | 8/2016 |
| CN | 110648595 | A | 1/2020 |
| CN | 111047995 | A | 4/2020 |
| CN | 111161636 | A | 5/2020 |
| CN | 111243432 | A | 6/2020 |
| WO | 2017113243 | A1 | 7/2017 |

OTHER PUBLICATIONS

First Office Action for CN Patent Application No. 202010543484.X dated Jul. 5, 2021.

* cited by examiner

*Primary Examiner* — Binh B Tran
(74) *Attorney, Agent, or Firm* — Thomas | Horstemeyer LLP

(57) ABSTRACT

The present disclosure relates to the field of display technologies, and proposes a scroll and a rollable display panel. The scroll is used for the rollable display panel. The rollable display panel includes a flexible panel and a control module for driving the flexible panel. The scroll includes: a first housing and a second housing; an accommodation space for accommodating the control module being formed between the first housing and the second housing; wherein, a surface for winding the flexible panel is formed by an outer surface of the first housing and/or the second housing.

20 Claims, 3 Drawing Sheets

140## SCROLL AND ROLLABLE DISPLAY PANEL

The present application is based upon and claims priority to Chinese Patent Application No. 202010543484.X, filed on Jun. 15, 2020, the entire disclosure of which is hereby incorporated by reference as a part of the present application.

TECHNICAL FIELD

The present disclosure relates to the field of display technologies and, in particular, to a scroll and a rollable display panel.

BACKGROUND

A rollable display panel includes a scroll and a display module. The display module may be wound on the scroll, or unwound from the scroll. The display module includes a flexible panel and a control module for driving the flexible panel to emit light. In the related art, one side of the flexible panel is fixed on the scroll, and the other side of the flexible panel is bound to the control module.

It should be noted that the information disclosed in the Background section above is only for enhancing the understanding of the background of the present disclosure, and thus may include information that does not constitute prior art known to those of ordinary skill in the art.

SUMMARY

The present disclosure provides a scroll and a rollable display panel.

Other characteristics and advantages of the present disclosure will become apparent through the following detailed description, or be learned partly through the practice of the present disclosure.

According to an aspect of the present disclosure, there is provided a scroll for a rollable display panel. The rollable display panel includes a flexible panel and a control module for driving the flexible panel. The scroll includes a first housing and a second housing. An accommodation space for accommodating the control module is formed between the first housing and the second housing. A surface for winding the flexible panel is formed by an outer surface of the first housing and/or the second housing.

In an exemplary embodiment of the present disclosure, cross sections of the first housing and the second housing perpendicular to an axial direction thereof are annular, and the first housing is sleeved outside the second housing, and the surface for winding the flexible panel is formed by the outer surface of the first housing.

In an exemplary embodiment of the present disclosure, the first housing and the second housing are clamped by a buckle.

In an exemplary embodiment of the present disclosure, the outer surface of the first housing is provided with a groove, a bottom of the groove is provided with an opening penetrating a side wall of the first housing, and an opening area of the opening is smaller than an area of the bottom of the groove; one end of the buckle is fixed to the outer surface of the second housing, and the other end passes through the opening in the first housing, the buckle is provided with a slot at a position opposite to a side wall of the opening, and the side wall of the opening is clamped in the slot.

In an exemplary embodiment of the present disclosure, the first housing and the second housing are connected by two sets of buckles, and the two sets of buckles are respectively located at both ends of the second housing along its axial direction, and each set of buckles includes a plurality of buckles distributed at intervals along a circumferential direction of the second housing.

In an exemplary embodiment of the present disclosure, the control module includes a driving chip and a flexible circuit board, a cross section of the first housing along its axial direction is a circular ring; the second housing includes a first flat plate portion and a second flat plate portion, and a space for accommodating the driving chip is formed between the first flat plate portion and the first housing; a space for accommodating the flexible circuit board is formed between the second flat plate portion and the first housing.

In an exemplary embodiment of the present disclosure, the control module further includes: an epitaxial crystallization film bound to the driving chip and the flexible circuit board, and the second housing includes an outer surface for fixing the epitaxial crystallization film.

In an exemplary embodiment of the present disclosure, the first housing is provided with a strip-shaped opening extending along its axial direction, and a side wall of the strip-shaped opening extending along the axial direction is inclined away from the opening to form an acute angle with an inner surface of the first housing.

In an exemplary embodiment of the present disclosure, a cross section of the first housing perpendicular to its axial direction is semi-annular, and the second housing is disposed at an opening side of the semi-annular of the first housing, the surface for winding the flexible panel is formed by a surface of the first housing away from the second housing and a surface of the second housing away from the first housing.

In an exemplary embodiment of the present disclosure, the second housing includes a fixing plate having a surface facing the opening side of the semi-annular of the first housing, and a length direction of the fixing plate is extended along the axial direction of the first housing.

In an exemplary embodiment of the present disclosure, the fixing plate is fixed to the first housing through two sets of fixing pillars; the two sets of fixing pillars are located at both ends of the fixing plate along its length direction, respectively, and each set of fixing pillars includes a plurality of fixing pillars distributed along a width direction of the fixing plate.

In an exemplary embodiment of the present disclosure, the control module includes: a driving chip, a flexible circuit board, and an epitaxial crystallization film bound to the driving chip and the flexible circuit board, and a portion of a surface of the first housing facing the second housing and a portion of a surface of the second housing facing the first housing are used for fixing the epitaxial crystallization film, and a portion of the second housing facing the first housing is used for fixing the driving chip and the flexible circuit board.

According to an aspect of the present disclosure, there is provided a rollable display panel, including the scroll, the flexible panel, and the control module.

In an exemplary embodiment of the present disclosure, the control module includes a flexible circuit board that is disposed in a folded manner in the scroll, and the flexible circuit board includes a first folded portion and a second folded portion that are disposed in the folded manner, the first folded portion is fixed to the second housing, and the second folded portion is fixed to the first folded portion or the epitaxial crystallization film through a padding pillar.

In an exemplary embodiment of the present disclosure, a side of the second folded portion facing the first folded portion is provided with a reinforcing pad, and the padding pillar is fixed between the reinforcing pad and the first folded portion.

It should be noted that the above general description and the following detailed description are merely exemplary and explanatory and should not be construed as limiting of the disclosure.

BRIEF DESCRIPTION OF THE DRAWINGS

The accompanying drawings, which are incorporated in the specification and constitute a part of the specification, show exemplary embodiments of the present disclosure. The drawings along with the specification explain the principles of the present disclosure. It is apparent that the drawings in the following description show only some of the embodiments of the present disclosure, and other drawings may be obtained by those skilled in the art without departing from the drawings described herein.

DETAILED DESCRIPTION

Figure 1:
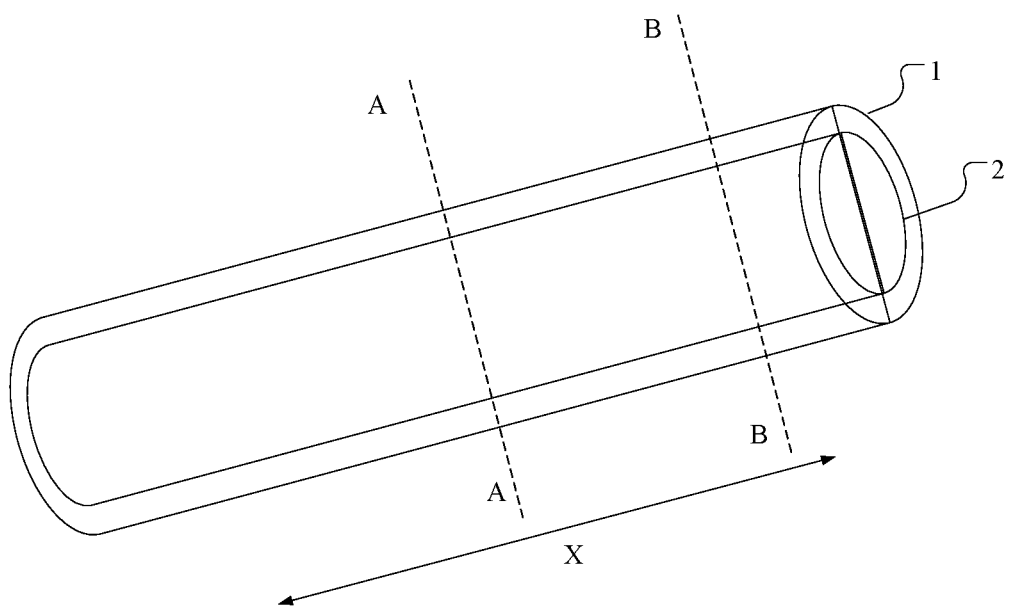
FIG. 1 is a schematic structural diagram of an exemplary embodiment of a scroll of the present disclosure.

Example embodiments will now be described more fully with reference to the accompanying drawings. However, the embodiments may be implemented in a variety of forms and should not be construed as being limited to the examples set forth herein; rather, these embodiments are provided so that the present disclosure will be more complete so as to convey the idea of the exemplary embodiments to those skilled in this art. The same reference numerals in the drawings denote the same or similar parts, and the repeated description thereof will be omitted.

Although the relative terms such as "above" and "below" are used in the specification to describe the relative relationship of one component to another component shown, these terms are only for convenience in this specification, for example, according to an exemplary direction shown in the drawings. It will be understood that if the device shown is flipped upside down, the component described "above" will become the component "below". Other relative terms, such as "high", "low", "top", "bottom", "left", "right", etc., also have similar meanings. When a structure is "on" another structure, it may mean that a structure is integrally formed on another structure, or that a structure is "directly" disposed on another structure, or that a structure is "indirectly" disposed on another structure through other structures.

The terms "one", "a", "the", and "said" are used to indicate that there are one or more elements/components or the like. The terms "include", "contain", and "have" are used to indicate an open meaning of including and means that there may be additional elements/components/etc. in addition to the listed elements/components/etc.

Figure 2:
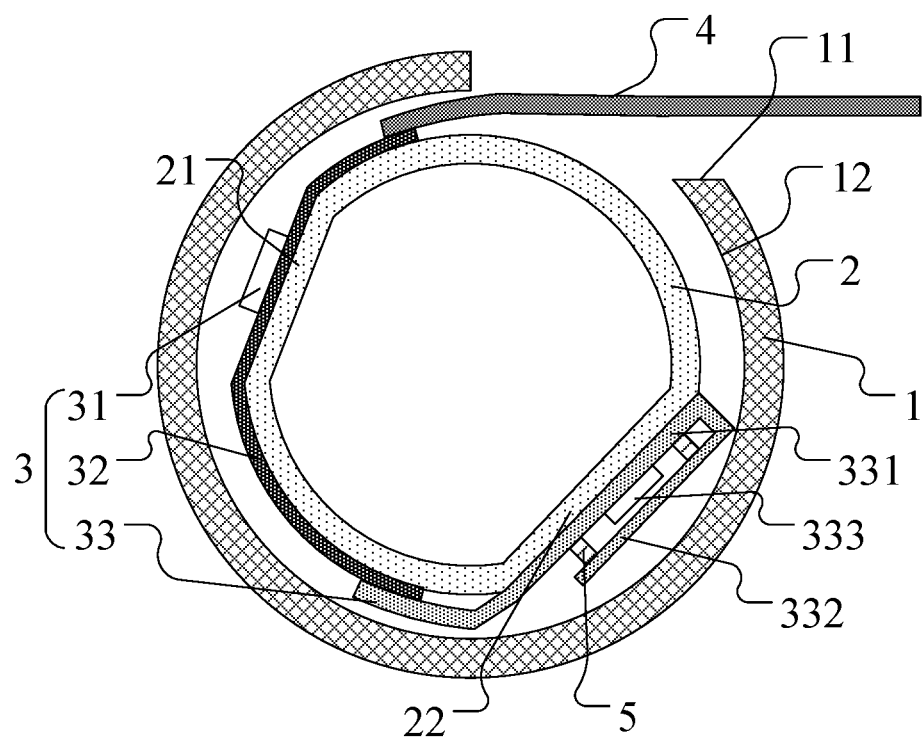
FIG. 2 is a cross sectional view at a dotted line A-A in FIG. 1.
Figure 3:
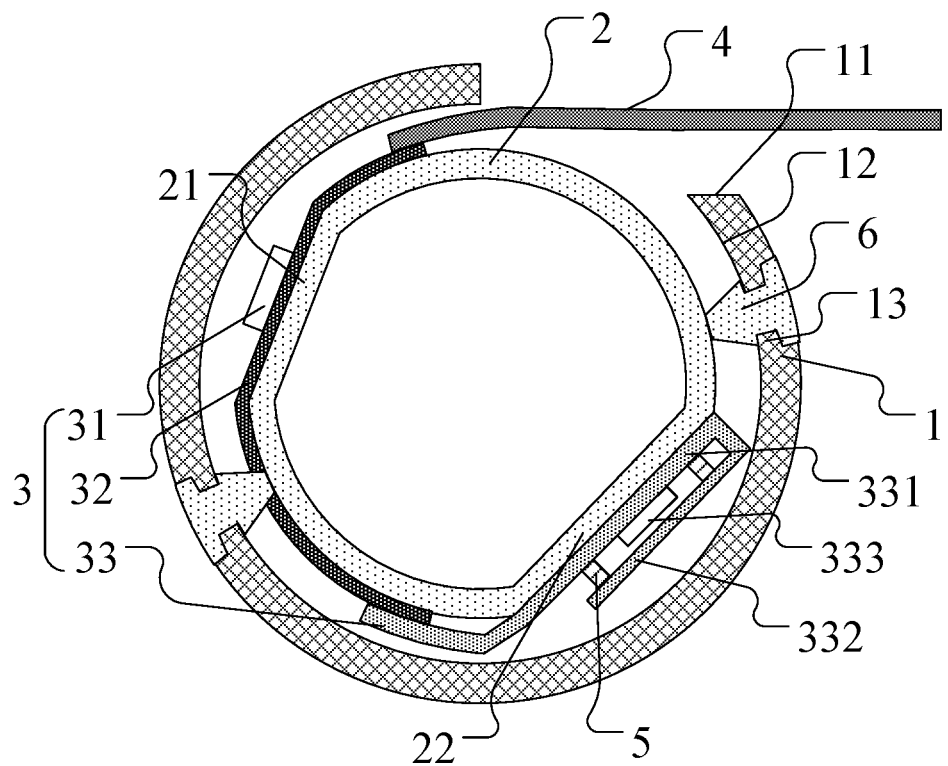
FIG. 3 is a cross sectional view at a dotted line B-B in FIG. 1.

An exemplary embodiment provides a scroll, as shown in FIGS. 1, 2, and 3. FIG. 1 is a schematic structural diagram of an exemplary embodiment of a scroll of the present disclosure, FIG. 2 is a cross sectional view at a A-A dotted line in FIG. 1, and FIG. 3 is a cross sectional view at a B-B dotted line in FIG. 1. The scroll is used for a rollable display panel. The rollable display panel includes a flexible panel and a control module for driving the flexible panel. The scroll includes a first housing 1 and a second housing 2; an accommodation space for accommodating the control module 3 is formed between the first housing 1 and the second housing 2; and an outer surface of the first housing 1 is used as a surface for winding the flexible panel.

The scroll provided by the exemplary embodiment may arrange the control module 3 between the first housing 1 and the second housing 2, so that the control module 3 may be protected by the first housing 1 and the second housing 2 to avoid damage to the control module caused by external objects. In addition, the scroll may also save space for arranging the control module.

In the exemplary embodiment, as shown in FIGS. 1, 2, and 3, cross sections of the first housing 1 and the second housing 2 perpendicular to an axial direction X thereof are annular, and the first housing 1 is sleeved outside the second housing 2. There may be a preset distance between an inner surface of the first housing 1 and an inner surface of the second housing 2 to form a space for accommodating the control module 3. Particularly, as shown in FIGS. 1, 2 and 3, the first housing 1 has a curved sheet shape to form an outer surface and an inner space, and the second housing 2 is accommodated in the inner space. The spacing in the inner space of the first housing 1 that is not occupied by the second housing 2 may be used for accommodating the control module 3.

In the exemplary embodiment, as shown in FIGS. 2 and 3, the control module 3 may include: a driving chip 31 and a flexible circuit board 33. A cross section of the first housing 1 along its axial direction X may be a circular ring. The second housing 2 may include a first flat plate portion 21 and a second flat plate portion 22, and a space for accommodating the driving chip 31 may be formed between the first flat plate portion 21 and the first housing 1, and a space for accommodating the flexible circuit board 33 may be formed between the second flat plate portion 22 and the first housing 1. The first flat plate portion 21 and the second flat plate portion 22 of the second housing 2 are of flat plate structures, and the first flat plate portion 21 and the second flat plate portion 22 may form a relatively large accommodating space with the first housing, respectively, so as to accommodate the driving chip 31 and the flexible circuit board 33, respectively.

As shown in FIGS. 2 and 3, in the exemplary embodiment, the control module 3 may further include: an-epitaxial crystallization film 32 bound to the driving chip 31 and the flexible circuit board 33, and the wafer-epitaxial crystallization film 32 is integrated with signal lines. The driving chip 31 may be bound to a middle position of the epitaxial crystallization film 32, and the flexible circuit board 33 and a flexible panel 4 may be bound to both ends of the epitaxial crystallization film 32, so that an image signal received by the flexible circuit board 33 drives the flexible panel 4 to emit light by the driving chip 31. In the exemplary embodiment, the second housing 2 may include an outer surface for fixing the epitaxial crystallization film 32, that is, the epitaxial crystallization film 32 may be fixed to the outer surface of the second housing 2. As shown in FIGS. 2 and 3, the flexible circuit board 33 may also be fixed to the outer surface of the second housing 2, and the flexible circuit board 33 may be disposed in a folded manner in the scroll, and the flexible circuit board 33 may include a first folded portion 331 and a second folded portion 332 that are disposed in the folded manner. The first folded portion 331 may be fixed to the second housing 2, and the second folded portion 332 may be fixed to the first folded portion 331 through a padding pillar 5. Disposing the flexible circuit board 33 in the folded manner may make full use of the space between the first housing 1 and the second housing 2, thereby improving space utilization. In addition, on the one hand, the padding pillar 5 may fix the second folded portion 332 to the first folded portion 331, and on the other hand, the padding pillar 5 may also avoid a device 333 (such as a capacitor, a resistor, etc.) integrated on a side of the first folded portion 331 facing the second folded portion 332 contacting with the second folded portion 332, thereby reducing the risk of damage to the device 333.

It should be understood that in other exemplary embodiments, the driving chip 31, the flexible circuit board 33, and the epitaxial crystallization film 32 may also be fixed to the inner surface of the first housing. The second folding portion 332 may also be fixed on the epitaxial crystallization film through the padding pillar 5.

In the exemplary embodiment, as shown in FIGS. 2 and 3, the first housing 1 may be provided with a strip-shaped opening extending along its axial direction X, and the flexible panel 4 may be bound to the epitaxial crystallization film 32 between the first housing 1 and the second housing 2 via the opening. A side wall 11 of the strip-shaped opening extending along the axial direction X may be inclined away from the opening to form an acute angle with the inner surface 12 of the first housing 1. This arrangement may make the flexible panel 4 fit with the side wall 11 when the flexible panel 4 is wound along the outer surface of the first housing 1, and the side wall 11 has a larger contact area with the flexible panel 4, thereby avoiding the side wall of the strip-shaped opening causing damage to the flexible panel.

In the exemplary embodiment, as shown in FIG. 3, the first housing 1 and the second housing 2 may be clamped by a buckle 6. The outer surface of the first housing 1 may be provided with a groove, and a bottom of the groove may be provided with an opening penetrating the side wall of the first housing 1. An opening area of the opening is smaller than an area of the bottom of the groove. One end of the buckle 6 is fixed to the outer surface of the second housing 2, and the other end passes through the opening in the first housing 1. The buckle 6 is provided with a slot at a position opposite to a side wall 13 of the opening, and the side wall 13 of the opening is clamped in the slot. A side of the buckle 6 away from the second housing 2 is located in the groove on the outer surface of the first housing 1, and the outer surface of the buckle 6 may be flush with the outer surface of the first housing or lower than the outer surface of the first housing, so as to prevent the buckle 6 protruding from the outer surface of the first housing from damaging the flexible panel. In the exemplary embodiment, the buckle 6 may be integrally formed with the second housing, and the buckle 6 may be made of a material with a certain elastic deformation, so that the buckle may be clamped with the side wall 13.

In the exemplary embodiment, as shown in FIGS. 1 and 3, the first housing and the second housing may be connected by two sets of buckles, and the two sets of buckles may be respectively located at both ends of the second housing along its axial direction, and each set of buckles may include two buckles, and the two buckles in the same set of buckles may be distributed at intervals along a circumferential direction of the second housing. As shown in FIG. 3, the two buckles in the same set of buckles may be located on the same cross section of the second housing perpendicular to its axial direction, and a line connecting the two buckles may pass through a circle of the circular cross section of the first housing. It should be understood that in other embodiments, one set of buckles may also include other numbers of buckles, and multiple buckles in the same set of buckles may not be located on the same cross section of the second housing perpendicular to its axial direction.

It should be understood that according to the embodiments of the present disclosure, although the second housing is referred to as a "housing", it may not be used to form the external housing part of the scroll. For example, in the embodiments of the present disclosure, the second housing is used to support the driving module, so it may also be referred to as a "supporter".

It should be understood that there are more selectable ways for the structures and relative positions of the first housing and the second housing. Correspondingly, the outer surface of the first housing and/or the second housing may be used as a surface for winding the flexible panel. For example, as shown in FIGS. 4 and 5, FIG. 4 is a schematic structural diagram of another exemplary embodiment of a scroll of the present disclosure, and FIG. 5 is a cross sectional view at a dashed line A-A in FIG. 4.

Figure 4:
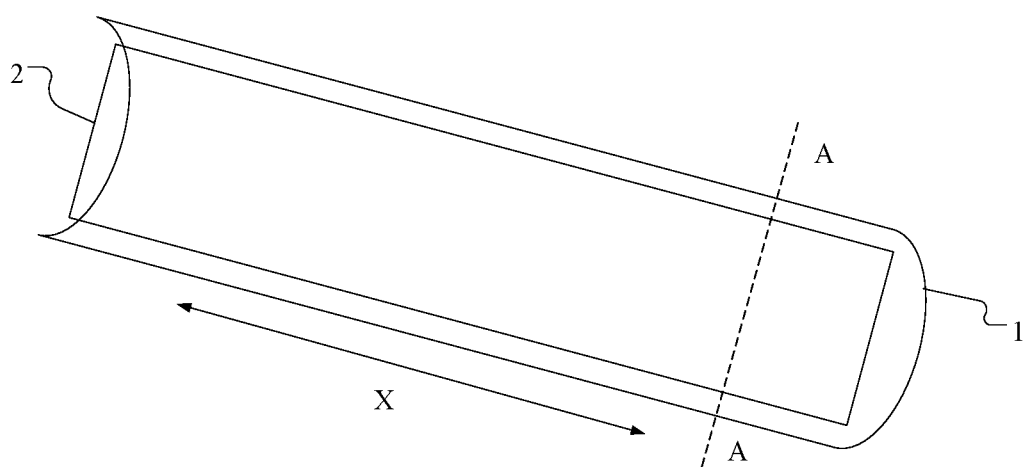
FIG. 4 is a schematic structural diagram of another exemplary embodiment of a scroll of the present disclosure.
Figure 5:
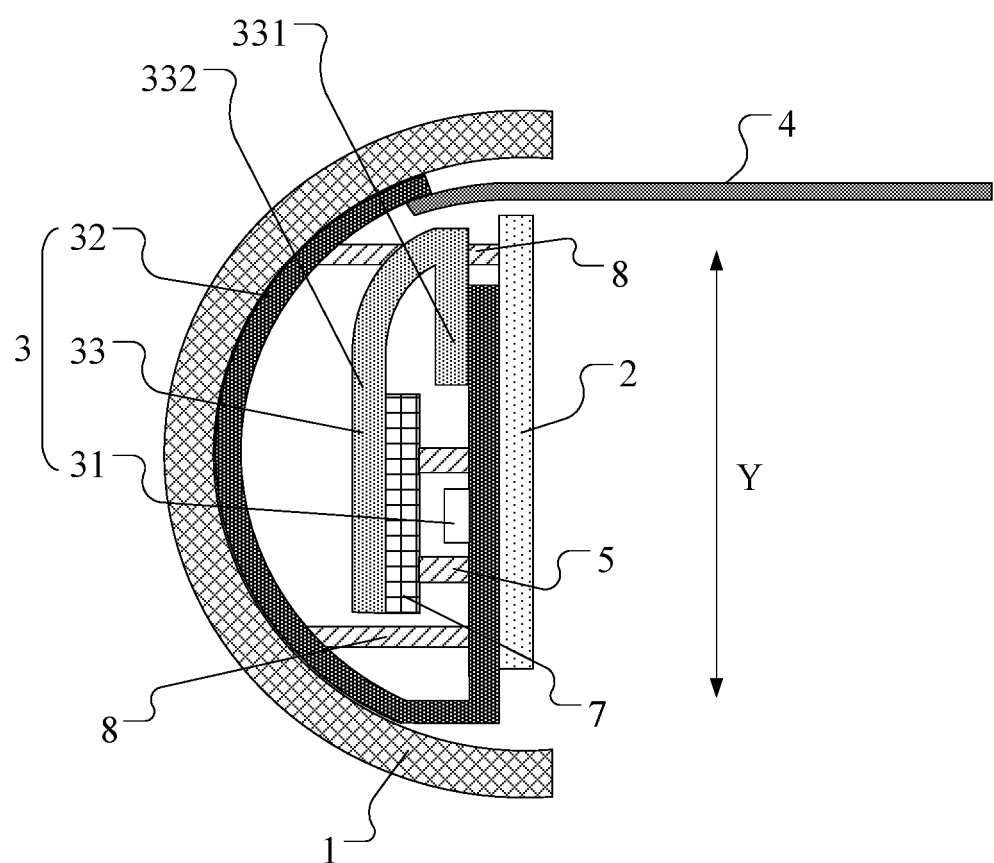
FIG. 5 is a cross sectional view at a dotted line A-A in FIG. 4.

In the exemplary embodiment, as shown in FIGS. 4 and 5, a cross section of the first housing 1 may be semi-annular along its axial direction X, and the second housing may be disposed on a side of the first housing 1 close to the opening side of the semi-annular. The control module 3 may be located between the first housing 1 and the second housing. A surface of the first housing 1 facing away from the second housing and a surface of the second housing facing away from the first housing 1 may be used for forming surfaces for winding the flexible panel 4. It should be understood that the terms "annular" or "semi-annular" in the present disclosure should not be interpreted as circular or semi-circular in the mathematical sense, but should be understood as having shapes similar to annular and semi-annular. For example, the semi-annular structure in the embodiment discussed in conjunction with FIGS. 4 and 5 should include the curved sheet-shaped first housing 1 having an opening exposing the internal space, so that the second housing is disposed at the opening and has an outer surface exposed to the outside through the opening. In addition, it should also be understood that the term "semi-annular" is not intended to mean one-half of an annular, but should be interpreted as having an incomplete annular shape.

In the exemplary embodiment, as shown in FIGS. 4 and 5, the second housing may include a fixing plate 2, and a panel of the fixing plate 2 faces an opening side of the semi-annular of the first housing 1, and a length direction of the fixing plate extends along the axial direction of the first housing 1.

In the exemplary embodiment, as shown in FIG. 5, the fixing plate 2 may be fixedly connected to the first housing 1 through two sets of fixing pillars 8; the two sets of fixing pillars 8 may be located at both ends of the fixing plate 2 along its length direction, respectively, and each set of fixing pillars includes two fixing pillars 8, and the two fixing pillars 8 may be located at both ends of the fixing plate 2 along its width direction. Disposing the two sets of fixing pillars 8 at both ends of the fixing plate 2 along its length direction may make the fixing pillars 8 avoid the arrangement positions of the control module 3, that is, the control module 3 is located between two sets of fixing pillars 8 in the axial direction X. It should be understood that, in other exemplary embodiments, each set of fixing pillars may further include a plurality of fixing pillars, and the plurality of fixing pillars may be distributed at intervals along the width direction Y of the fixing plate 2.

In the exemplary embodiment, as shown in FIG. 5, the control module 3 may include: a driving chip 31, a flexible circuit board 33, and an epitaxial crystallization film 32 bound to the driving chip 31 and the flexible circuit board 33. A portion of a surface of the first housing 1 facing the second housing and a portion of a surface of the second housing facing the first housing 1 may be used for fixing the epitaxial crystallization film 32, and a portion of the second housing facing the first housing 1 may be used for fixing the driving chip 31 and the flexible circuit board 33. The epitaxial crystallization film 32 may be fixed to the first housing and the second housing by means of photosensitive glue. As shown in FIG. 5, the flexible circuit board 33 may include a first folded portion 331 and a second folded portion 332 that are disposed in a folded manner. The first folded portion 331 may be fixed to the fixing plate 2, and an orthographic projection of the second folded portion 332 on the fixing plate at least partially overlaps with an orthographic projection of the epitaxial crystallization film 32 on the fixing plate. The second folded portion 332 may be fixed to the epitaxial crystallization film 32 through the padding pillar 5. Disposing the flexible circuit board 33 in the folded manner may make full use of the space between the first housing 1 and the second housing 2, thereby improving space utilization. As shown in FIG. 5, a side of the second folded portion 332 facing the first folded portion 331 may also be provided with a reinforcing pad 7, and the padding pillar 8 may be fixed between the reinforcing pad 7 and the epitaxial crystallization film 32. The reinforcing pad 7 may improve the rigidity of the flexible circuit board and avoid bending damage of the flexible circuit board. The reinforcing pad 7 may be a material with higher rigidity such as a metal plate or a tempered glass plate. It should be understood that, in other exemplary embodiments, the second folded portion 332 may also be fixed to the first folded portion 331 through the padding pillar 5.

The exemplary embodiment also provides a rollable display panel, including the scroll, the flexible panel, and the control module.

In the exemplary embodiment, the control module includes a flexible circuit board that is disposed in a folded manner in the scroll, and the flexible circuit board includes a first folded portion and a second folded portion that are disposed in the folded manner, the first folded portion is fixed to the first housing, and the second folded portion is fixed to the first folded portion or the epitaxial crystallization film through the padding pillar.

In the exemplary embodiment, a side of the second folded portion facing the first folded portion is provided with a reinforcing pad, and the padding pillar is fixed between the reinforcing pad and the first folded portion.

The rollable display panel provided by the exemplary embodiment has been described in detail in the foregoing content, and will not be repeated here.

The present disclosure provides the scroll and the rollable display panel, the scroll is used for the rollable display panel. The rollable display panel includes the flexible panel and the control module for driving the flexible panel. The scroll includes: the first housing and the second housing; the accommodation space for accommodating the control module is formed between the first housing and the second housing; and the outer surface of the first housing and/or the second housing is used as a surface for winding the flexible panel. The scroll provided by the present disclosure may arrange the control module between the first housing and the second housing, so that the control module may be protected by the first housing and the second housing. In addition, the scroll may also save space for arranging the control module.

Other embodiments of the present disclosure will be apparent to those skilled in the art from consideration of the specification and practice of the present disclosure disclosed herein. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

It should be understood that the present disclosure is not limited to the precise structures that have been described above and shown in the drawings, and various modifications and changes may be made without departing from the scope thereof. The scope of the present disclosure is limited only by the appended claims.

What is claimed is:

1. A scroll for a rollable display panel, the rollable display panel comprising a flexible panel and a control module for driving the flexible panel, wherein the scroll comprises:
    a housing have a curved sheet shape to form an outer surface and an inner space; and
    a supporter, disposed in the inner space of the housing and configured to support the control module;
    wherein, a surface for winding the flexible panel is formed by the outer surface of the housing.

2. The scroll according to claim 1, wherein the supporter is sleeved in the inner space of the housing, and a surface for supporting the driving module is formed by an outer surface of the supporter.

3. The scroll according to claim 2, wherein the housing and the supporter are clamped by a buckle.

4. The scroll according to claim 3, wherein the outer surface of the housing is provided with a groove, a bottom of the groove is provided with an opening penetrating a side wall of the housing, and an opening area of the opening is smaller than an area of the bottom of the groove, one end of the buckle is fixed to the outer surface of the supporter, and the other end passes through the opening in the housing, the buckle is provided with a slot at a position opposite to a side wall of the opening, and the side wall of the opening is clamped in the slot.

5. The scroll according to claim 3, wherein the housing and the supporter are connected by two sets of buckles, and the two sets of buckles are located at both ends of the supporter along its axial direction, respectively, and each set of buckles comprises a plurality of buckles distributed at intervals along a circumferential direction of the supporter.

6. The scroll according to claim 2, wherein the control module comprises a driving chip and a flexible circuit board, the cross section of the housing along its axial direction is a circular ring, and the supporter comprises a first flat plate portion and a second flat plate portion, and a space for accommodating the driving chip is formed between the first flat plate portion and the housing; a space for accommodating the flexible circuit board is formed between the second flat plate portion and the housing.

7. The scroll according to claim 6, wherein the control module further comprises: an epitaxial crystallization film bound to the driving chip and the flexible circuit board, and the supporter comprises the outer surface for fixing the epitaxial crystallization film.

8. The scroll according to claim 2, wherein the housing is provided with a strip-shaped opening extending along its axial direction, and a side wall of the strip-shaped opening extending along the axial direction is inclined away from the opening to form an acute angle with an inner surface of the housing.

9. The scroll according to claim 1, wherein the housing has an opening exposing the inner space, and the supporter is disposed at the opening and having an inner surface facing the inner space and an outer surface exposed at the opening, and wherein the inner surface is used for supporting the control module, and the surface for winding the flexible panel is formed by the external surface of the supporter and the outer surface of the housing.

10. The scroll according to claim 9, wherein a cross section of the housing perpendicular to its axial direction is semi-annular, and the supporter comprises: a fixing plate having a surface facing the opening side of the semi-annular of the housing, and a length direction of the fixing plate is extended along an axial direction of the housing.

11. The scroll according to claim 10, wherein the fixing plate is fixed to the housing through two sets of fixing pillars; and
the two sets of fixing pillars are located at both ends of the fixing plate along its length direction, respectively, and each set of fixing pillars comprises a plurality of fixing pillars distributed along a width direction of the fixing plate.

12. The scroll according to claim 10, wherein the control module comprises:
a driving chip, a flexible circuit board, and an epitaxial crystallization film bound to the driving chip and the flexible circuit board, a portion of a surface of the housing facing the supporter and a portion of a surface of the supporter facing the housing are used for fixing the epitaxial crystallization film, and a portion of the surface of the supporter facing the housing is used for fixing the driving chip and the flexible circuit board.

13. A rollable display panel, comprising:
a scroll, a flexible panel, and a control module for driving the flexible panel, wherein the scroll comprises:
a housing have a curved sheet shape to form an outer surface and an inner space; and
a supporter, disposed in the inner space of the housing and configured to support the control module;
wherein, a surface for winding the flexible panel is formed by the outer surface of the housing.

14. The rollable display panel according to claim 13, wherein the supporter is sleeved in the inner space of the housing, and a surface for supporting the driving module is formed by an outer surface of the supporter.

15. The rollable display panel according to claim 14, wherein the housing and the supporter are clamped by a buckle.

16. The rollable display panel according to claim 15, wherein the outer surface of the housing is provided with a groove, a bottom of the groove is provided with an opening penetrating a side wall of the housing, and an opening area of the opening is smaller than an area of the bottom of the groove, one end of the buckle is fixed to the outer surface of the supporter, and the other end passes through the opening in the housing, the buckle is provided with a slot at a position opposite to a side wall of the opening, and the side wall of the opening is clamped in the slot.

17. The rollable display panel according to claim 13, wherein the housing has an opening exposing the inner space, and the supporter is disposed at the opening and having an inner surface facing the inner space and an outer surface exposed at the opening, and wherein the inner surface is used for supporting the control module, and the surface for winding the flexible panel is formed by the external surface of the supporter and the outer surface of the housing.

18. The rollable display panel according to claim 17, wherein a cross section of the housing perpendicular to its axial direction is semi-annular, and the supporter comprises: a fixing plate having a surface facing the opening side of the semi-annular of the housing, and a length direction of the fixing plate is extended along an axial direction of the housing.

19. The rollable display panel according to claim 13, wherein the control module comprises a flexible circuit board that is disposed in a folded manner in the scroll, and the flexible circuit board comprises a first folded portion and a second folded portion that are disposed in the folded manner, the first folded portion is fixed to the supporter, and the second folded portion is fixed to the first folded portion or the epitaxial crystallization film through a padding pillar.

20. The rollable display panel according to claim 19, wherein a side of the second folded portion facing the first folded portion is provided with a reinforcing pad, and the padding pillar is fixed between the reinforcing pad and the first folded portion.

* * * * *